(12) United States Patent
Oshida et al.

(10) Patent No.: US 8,089,614 B2
(45) Date of Patent: Jan. 3, 2012

(54) DEVICE FOR CHANGING PITCH BETWEEN LIGHT BEAM AXES, AND SUBSTRATE EXPOSURE APPARATUS

(75) Inventors: Yoshitada Oshida, Ebina (JP); Yoshitatsu Naito, Ebina (JP); Mituhiro Suzuki, Ebina (JP); Tsuyoshi Yamaguchi, Ebina (JP); Shigenobu Maruyama, Yokohama (JP)

(73) Assignee: Hitachi Via Mechanics, Ltd., Ebina-shi (JP)

( * ) Notice: Subject to any disclaimer, the term of this patent is extended or adjusted under 35 U.S.C. 154(b) by 749 days.

(21) Appl. No.: 11/755,361

(22) Filed: May 30, 2007

(65) Prior Publication Data

US 2007/0279609 A1    Dec. 6, 2007

(30) Foreign Application Priority Data

May 30, 2006    (JP) .................................. 2006-150431

(51) Int. Cl.
   *G03B 27/53*    (2006.01)
(52) U.S. Cl. .............................. 355/70; 355/67; 359/833
(58) Field of Classification Search .................. 359/833, 359/834; 355/53, 67, 77, 70
   See application file for complete search history.

(56) References Cited

U.S. PATENT DOCUMENTS

| 4,690,490 | A  | * | 9/1987 | Mori ............................. 385/47 |
| 5,890,796 | A  | * | 4/1999 | Marinelli et al. ............. 362/307 |
| 2005/0219496 | A1 | * | 10/2005 | Oshida et al. .................. 355/67 |
| 2006/0098700 | A1 | * | 5/2006 | Alahautala et al. ...... 372/29.014 |

FOREIGN PATENT DOCUMENTS

JP    2005-316349 A    10/2005

* cited by examiner

*Primary Examiner* — Mark Consilvio
(74) *Attorney, Agent, or Firm* — Crowell & Moring LLP

(57) ABSTRACT

A parallel glass which is a prism having a parallelogram-shaped cross section in an x-y direction, and parallel glasses which are prisms having a parallelogram-shaped cross section in the x-y direction and each include grooves formed in one surface in a z direction perpendicular to the x-y direction, are stacked in direct contact with each other such that the grooves are located on the inside, and light trying to enter the grooves is subjected is total reflection, thereby changing incident parallel beams with a pitch of 13 mm into emergent parallel beams with a pitch of 1 mm.

13 Claims, 7 Drawing Sheets

(A)

(B)

DEVICE FOR CHANGING PITCH BETWEEN LIGHT BEAM AXES, AND SUBSTRATE EXPOSURE APPARATUS

BACKGROUND OF THE INVENTION (1) Field of the Invention

The present invention relates to a device for changing a pitch between light beam axes to another desired pitch, and a maskless substrate exposure apparatus which includes the device for changing the pitch between the axes of the light beams outputted from multiple light sources arranged in a matrix serve as its light source.

(2) Description of the Related Art

In the related art, to form a pattern on a printed circuit board, a TFT substrate or color filter substrate of a liquid crystal display, or a substrate of a plasma display by exposure, a mask that serves as a master for the pattern is produced, and this master mask pattern is transferred onto the above-mentioned substrate by exposure with a mask exposure apparatus.

However, substrates are becoming increasingly larger in size in recent years. Moreover, the time taken to design and manufacture these substrates is becoming increasingly shorter. In view of this, so-called maskless exposure methods without using any masks have been put into practical use. Examples of these maskless exposure methods include a method of generating a two-dimensional pattern using a two-dimensional spatial modulator such as liquid crystal or DMD (Digital Mirror Device) and subjecting this two-dimensional pattern to exposure on the substrate with a projection lens, and a method of performing drawing and exposure on a substrate with laser light by using an EO modulator or AO modulator while performing scanning by using a large-output laser and a polygon mirror. Although the former method enables drawing of a relatively fine pattern, the method increases apparatus cost. On the other hand, although the latter method enables drawing of a rough pattern over a large area and allows relatively low-cost production due to the simple configuration, it is difficult to perform high-precision drawing over a large surface area. Further, a large-output laser is required to make the throughput time shorter, which leads to high apparatus cost and also high running cost.

In view of this, there is known a pattern exposure apparatus which realizes short throughput time, low cost, and reduced running cost by using multiple semiconductor lasers as the light source (Japanese Patent Application Laid-Open Publication No. 2005-316349).

SUMMARY OF THE INVENTION

However, the beam-pitch-reducing means without beam diameter change described in Japanese Patent Application Laid-Open Publication No. 2005-316349, not only a large number of parts are required, but also the resulting structure inevitably becomes expensive if the parallelism of beams is to be improved. Further, careful handling is required due to the small thickness of the prism.

The present invention has been made in view of the above circumstances and aims to allow for easy processing and handling and also improved parallelism of beams.

According to a first aspect of the present invention, there is provided a device for changing a pitch between light beam axes, including: a first transparent member in the shape of a prism whose cross section in an x-y direction is a parallelogram; and at least one second transparent member in the shape of a prism whose cross section in the x-y direction is a parallelogram, the second transparent member including a groove formed in one surface in a z direction perpendicular to the x-y direction. The first transparent member and the second transparent member are stacked in direct contact with each other with the groove located on an inner side so that light trying to enter the groove is subjected to total reflection by the groove.

According to a second aspect of the present invention, there is provided a substrate exposure apparatus in which a spacing between optical axes of parallel beams on one side is changed by a device for changing a pitch between light beam axes, the parallel beams being outputted from a plurality of light sources arranged in a matrix and having optical axes that are spaced equidistant from each other, and in which light beams outputted from the light sources are radiated onto a target exposure substrate, the substrate exposure apparatus including the device for changing a pitch between light beam axes according to the first aspect of the present invention.

According to the present invention, since multiple pairs of light beams can be arranged in the board thickness direction even when there are provided one first transparent member and one second transparent, thereby achieving reduced number of parts and greater workability, and also improved parallelism of emergent light beams. Since the thickness is increased, handling operability is improved.

BRIEF DESCRIPTION OF THE DRAWINGS

These and other features, objects and advantages of the present invention will become more apparent from the following description when taken in conjunction with the accompanying drawings wherein.

DETAILED DESCRIPTION OF THE PREFERRED EMBODIMENTS

Figure 1:
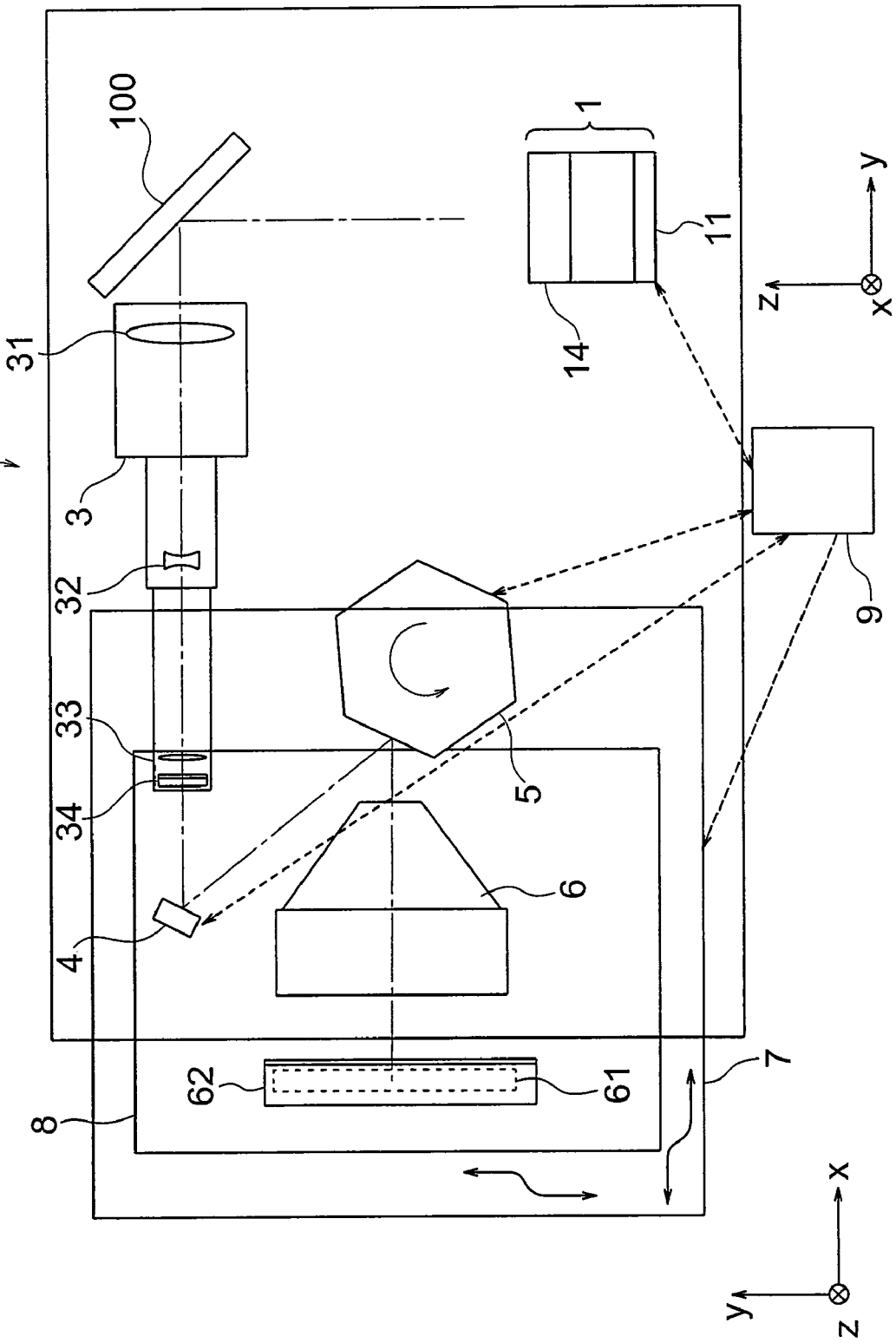
FIG. 1 is a view showing the general configuration of an exposure apparatus according to an embodiment of the present invention.
Figure 2:
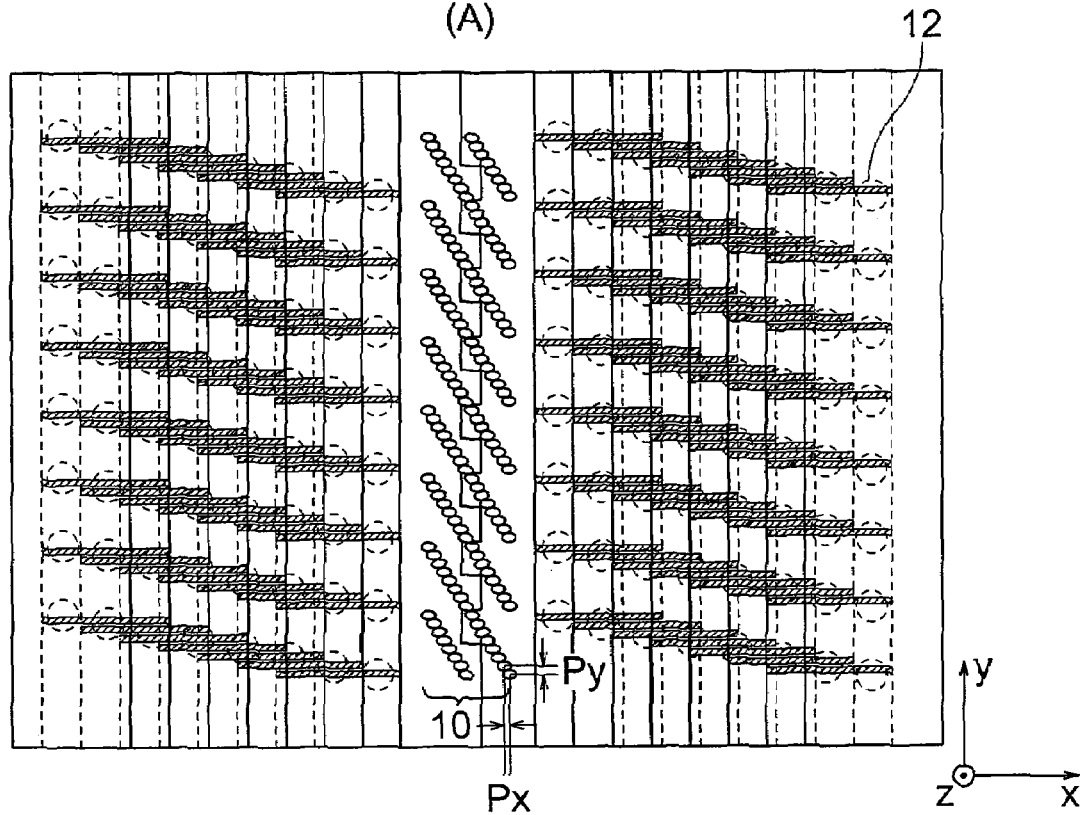
FIGS. 2A and 2B are views illustrating a light source optical system according to an embodiment of the present invention.
Figure 2:
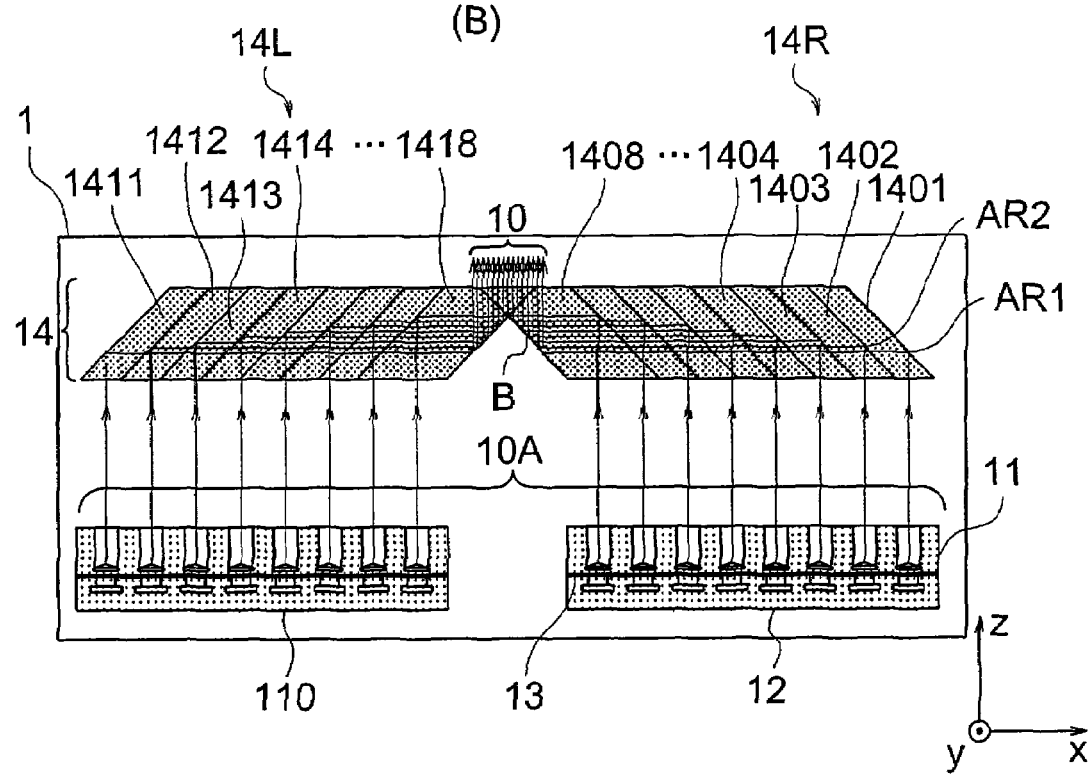
Figure 3:
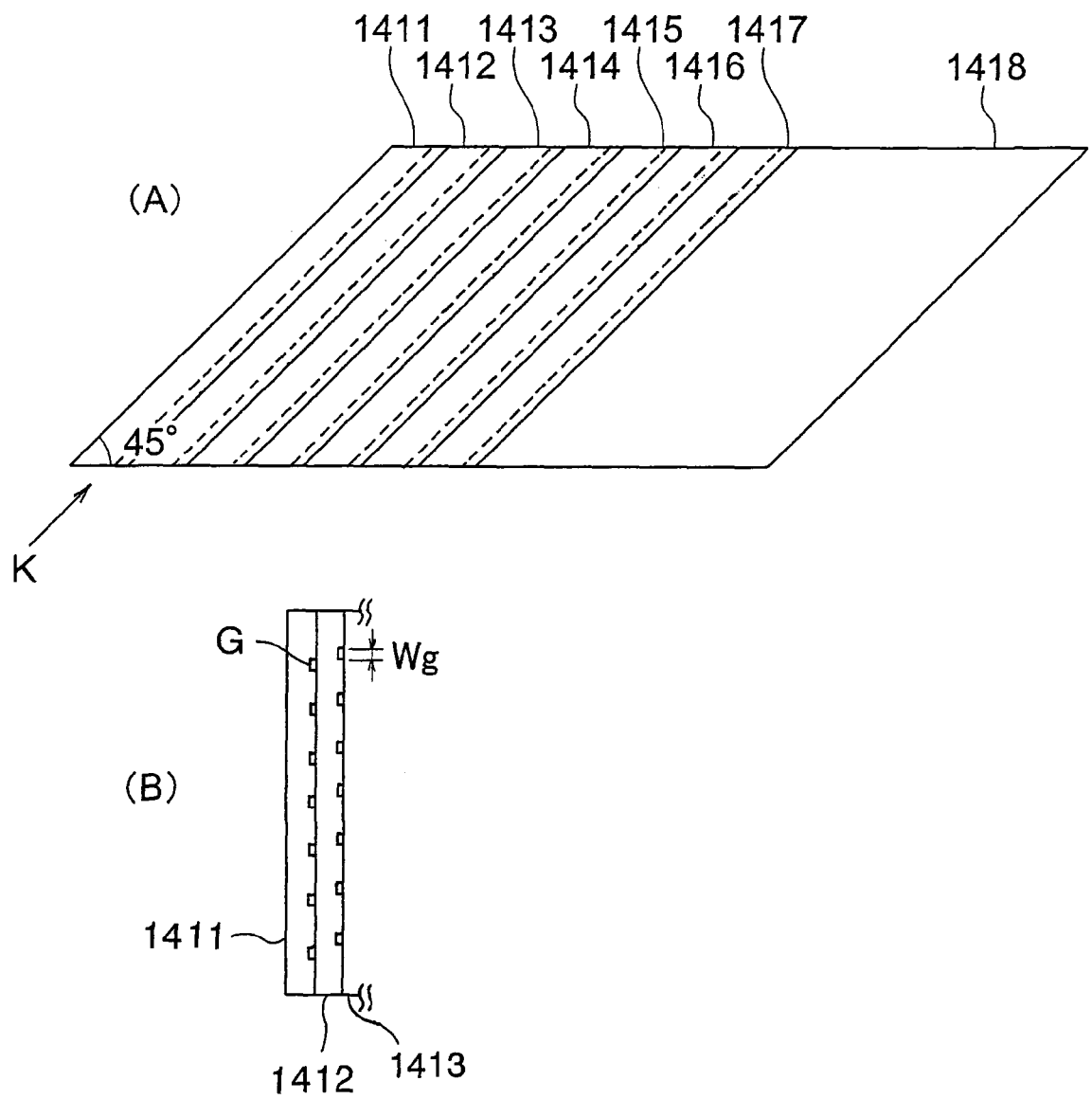
FIGS. 3A and 3B are views illustrating the configuration of an integrated parallel-glass unit according to an embodiment of the present invention.
Figure 4:
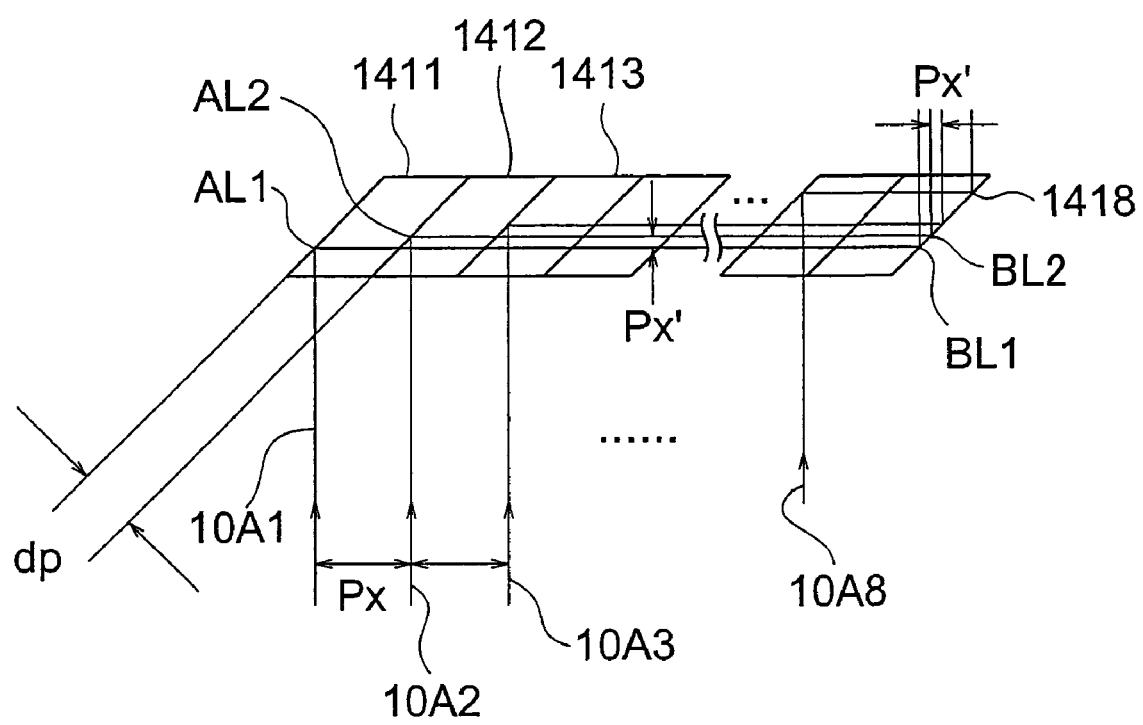
FIG. 4 is a view illustrating the operation of an integrated parallel-glass unit according to an embodiment of the present invention.
Figure 5:
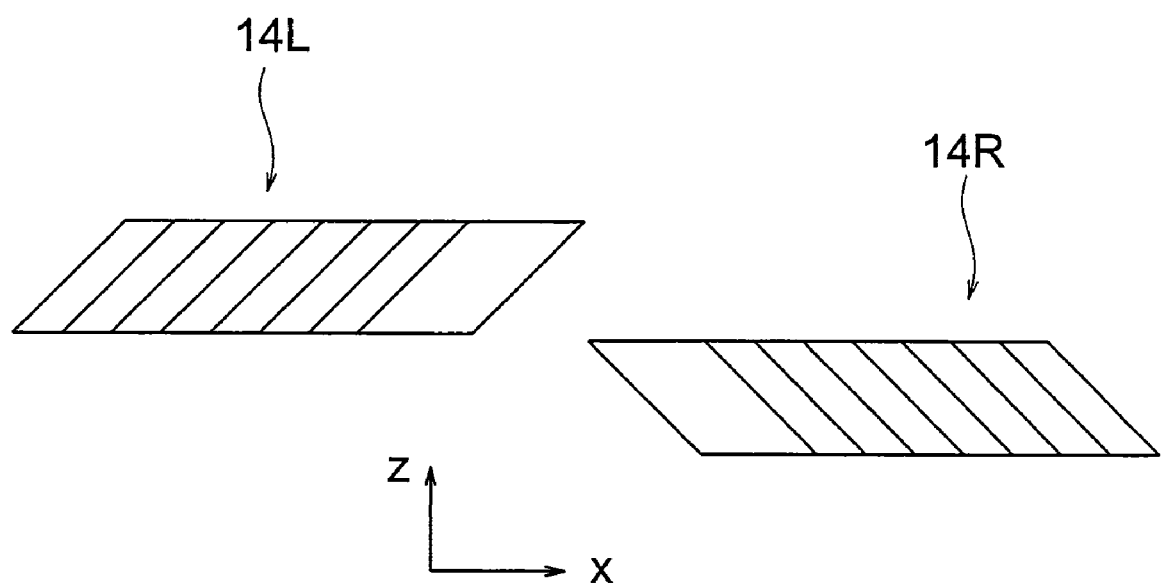
FIG. 5 is a view showing another arrangement example of the integrated parallel-glass unit.
Figure 6:
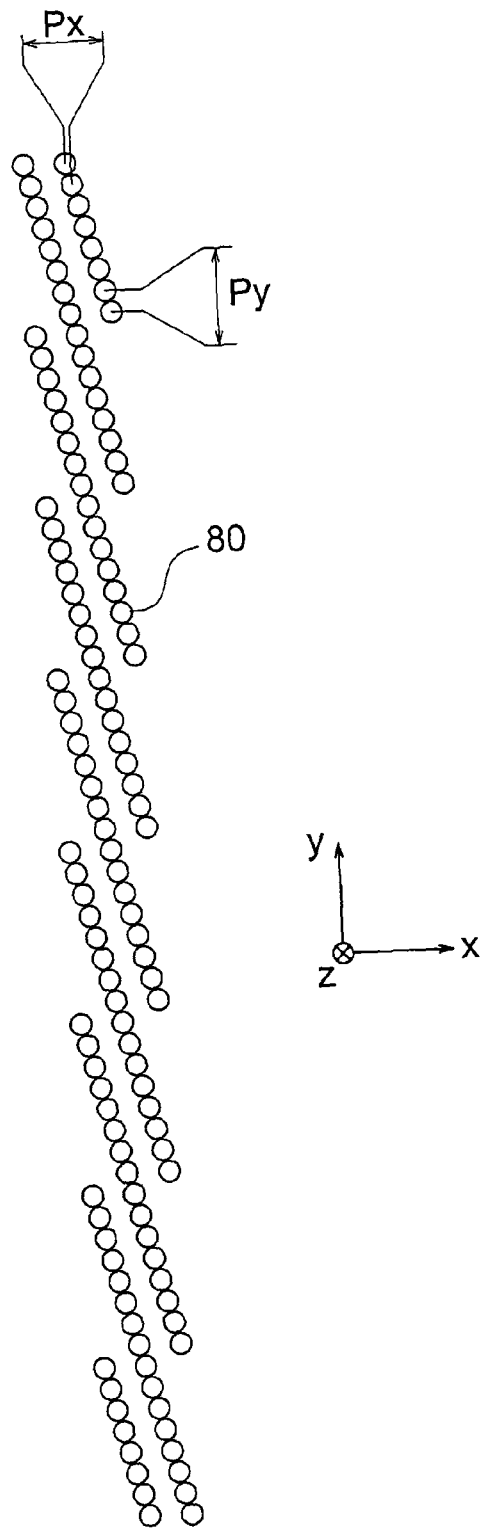
FIG. 6 is a view showing the arrangement of light beams on an exposure surface.
Figure 7:
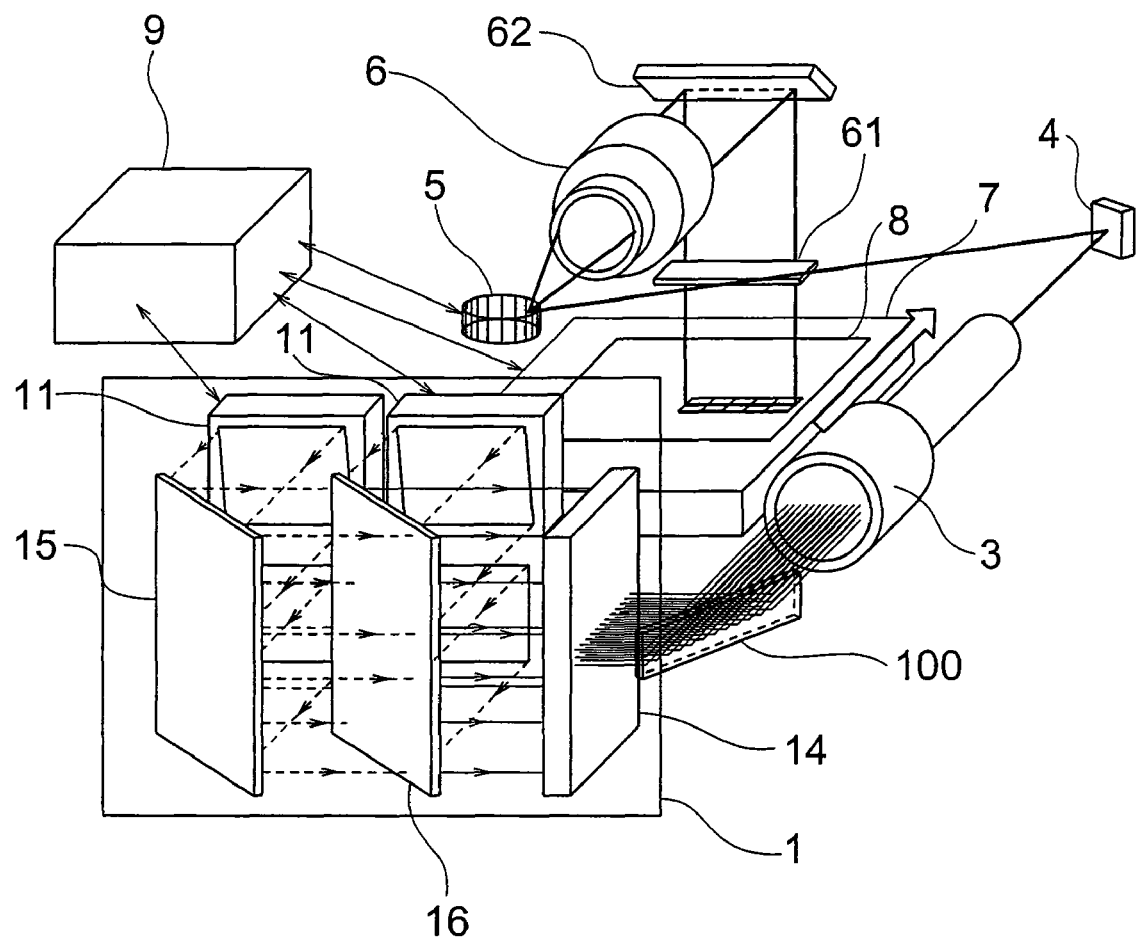
FIG. 7 is a view showing the general configuration of another exposure apparatus according to an embodiment of the present invention.

FIG. 1 is a view showing the general configuration of an exposure apparatus according to an embodiment of the present invention, FIGS. 2A and 2B are views illustrating a light source optical system according to an embodiment of the present invention, FIGS. 3A and 3B are views illustrating the configuration of an integrated parallel-glass unit 14L according to an embodiment of the present invention, FIG. 4 is a view illustrating the operation of an integrated parallel-glass unit according to an embodiment of the present invention, FIG. 5 is a view showing another arrangement example of an integrated parallel-glass unit, FIG. 6 is a view showing the arrangement of light beams in an exposure surface, and FIG. 7 is a view showing the general configuration of another exposure apparatus according to an embodiment of the present invention.

An exposure apparatus 200 includes a light source optical system 1, a mirror 100, a long-focus lens 3, a mirror 4, a polygon mirror 5, an fθ lens 6, a return mirror 62, a cylindrical lens 61, a stage 7, and a control circuit 9. The light source optical system 1 includes a multiple-parallel-beam generating unit 11 and an integrated parallel-glass unit 14. An exposure substrate 8 is fixed on the stage 7.

FIG. 2A is a front view (as seen from the mirror 100 side; the left side in the drawing corresponds to the upper side) of the light source optical system 1. FIG. 2B is a schematic sectional plan view of the light source optical system 1 as seen from the side surface.

The multiple-parallel-beam generating unit 11 includes a holder 110 formed of a copper material, semiconductor lasers (hereinafter, referred to as the "LDs") 12, and aspherical lenses 13. In the holder 110, 16 (8 on the left and 8 on the right) LDs each having an outer diameter of 5 to 6 mm and mounted on a can package at a pitch of 13 mm, and 8 LDs are respectively arranged in the x direction and y direction, that is, a total of 128 LDs are arranged. It should be noted that as indicated by the dotted lines in FIG. 2A, each LD 12 is arranged so as to be shifted by 13/8 mm from the LD 12 of an adjacent row. Further, the aspherical lenses 13 are arranged on the respective optical axes of light beams emitted from the LDs 12. Each LD 12 outputs laser light with a full angle of divergence at half maximum (divergence angle) in the x direction of about 22 degrees, and a divergence angle in the y direction of about 8 degrees.

Next, the integrated parallel-glass unit 14 will be described.

As shown in FIG. 2B, the integrated parallel-glass unit 14 includes parallel glasses 1401 to 1408 (hereinafter, this group of glasses will be referred to as "integrated parallel-glass unit 14R") and parallel glasses 1411 to 1418 (hereinafter, this group of glasses will be referred to as "integrated parallel-glass unit 14L"), each of which is a parallelogram in cross section.

FIGS. 3A and 3B are views illustrating the configuration of the integrated parallel-glass unit 14 on the left side in the drawing, of which FIG. 3A is a view showing the entire integrated parallel-glass unit 14L, and FIG. 3B is a view as seen from the arrow K in FIG. 3A. Each individual parallel glass is a parallelogram whose one vertex angle is 45 degrees. As shown in FIG. 3B, rectangular grooves G are formed on the right side surface of the parallel glass 1411. In this embodiment, the width W of the grooves G is 1.6 mm. The other surfaces of the parallel glass 1411 are flat. The grooves G are also formed on the right side surfaces of the parallel glasses 1412 to 1417 (however, the grooves G are shifted from each other by 13/8 mm in the height direction). In contrast, all the surfaces of the parallel glass 1418 are flat.

The parallel glasses 1401 to 1408 and 1411 to 1418 are held in direct contact with each other by means of so-called optical contact. As compared with the case of using an adhesive, the use of optical contact makes it possible to achieve a considerable improvement in the parallelism of parallel beams 10, and also eliminates reflection loss resulting from a mismatch in refractive index between an adhesive and glass. Further, there is no fear of degradation of an adhesive, which occurs when parallel beams 10A are ultraviolet light or near ultraviolet light.

Next, the operation of the integrated parallel-glass unit 14 will be described.

As shown in FIG. 4, laser light 10A1, which corresponds to laser light 10A at the left end made to enter the parallel glass 1411 from the lower part of the drawing, undergoes total reflection at AL1 as the boundary with air, and travels rightward in the drawing. Subsequently, the laser light 10A1 passes through the parallel glasses 1412 to 1418, undergoes total reflection at BL1 as the boundary with air to travel upward in the drawing, and emerges from the upper surface of the parallel glass 1418. Further, a parallel beam 10A2, which enters the parallel glass 1412 from in the lower part of the drawing and located second from the left, undergoes total reflection at AL2 corresponding to grooves formed in the parallel glass 1411, and then travels rightward in the drawing. Subsequently, the parallel beam 10A2 passes through the parallel glasses 1413 to 1418, undergoes total reflection at BL2 as the boundary with air to travel upward in the drawing, and emerges from the upper surface of the parallel glass 1418. Likewise, at the time when another parallel beam 10A tries to transmit through a parallel glass, because the grooves G are provided in the next parallel glass, the parallel beam 10A undergoes total reflection at that location. That is, incident parallel beams 10A with a pitch Px of 13 mm emerge from the parallel glass 1418 as parallel beams 10 with a pitch Px' (in this case, 1 mm). Likewise, on the integrated parallel-glass 14R side as well, incident parallel beams 10A with a pitch Px of 13 mm emerge from the parallel glass 1408 as parallel beams 10 with a pitch Px' (in this case, 1 mm). As shown in FIG. 2A, the overlapping portions of the parallel glass 1408 and parallel glass 1418 are fixed in an engaged manner (each edge is formed in a comb-tooth shape and engaged), so there is no fear of the optical path of the parallel beams 10A being disturbed.

While each groove G is rectangular in this embodiment, since it suffices to realize total reflection of light beams trying to enter the grooves G, the shape of the groove G may be a V shape, a U shape, or the other such shape as long as an air space larger than the width W can be formed.

Next, a spacing dp between parallel glasses (that is, the thickness of the parallel glasses) will be described.

As shown in FIG. 4, from the pitch Px of incident parallel beams 10A and the pitch Px' of emergent parallel beams 10, the spacing dp can be determined by the following equation.

$$dp=(Px-Px')/\sqrt{2}$$

Accordingly, if the pitch Px of incident parallel beams 10 is 13 mm, and the pitch Px' of emergent parallel beams 10 is 1 mm, the spacing dp may be set as 8.5 mm.

To keep the parallel beams 10 parallel, it is important that the incident surface and the emergent surface be parallel to each other (the parallelism between adjacent reflection surfaces be within 30 seconds for practical use, preferably 10 seconds). In this regard, it is relatively easy to process the parallel glasses to a parallelism on the order of 1 second. Further, it is also relatively easy to process the incident face and the emergent face to be parallel to each other after integrating the parallel glasses into a unit. Further, the loss at reflection is 0 since the reflection is total reflection. Further, when anti-reflection coating is applied to the incident surface and the emergent surface, since the resulting reflection is normal incidence reflection, the loss at these surfaces can be made to 0.2% or less.

It should be noted that as shown in FIG. 5, it is also possible to arrange the integrated parallel-glass unit 14R and the integrated parallel-glass unit 14L so as to be shifted from each other in the z direction.

Further, instead of achieving direct contact between the parallel glasses 1401 to 1408 and 1411 to 1418 by means of optical contact, a transparent adhesive may be used.

Further, since silica exhibits extremely small thermal expansion in comparison to other glass materials, if silica glass is used as the glass, when optical contact is employed, there is little fear of the parallel glasses coming out of optical contact due to thermal change, thereby making it possible to produce a stable high-performance parallel glass unit.

Further, the parallel glasses 1401 to 1408 and 1411 to 1418 may be formed of a transparent material other than glass.

The long-focus lens 3 includes spherical type lenses 31, 32, 33, and a cylindrical lens 34 having power in the x direction and with a focal length fc. The lenses 31, 32, 33 are each formed by multiple lenses, and the overall focal length is fo.

Next, operation will be described.

The laser beams outputted from the LDs 12 and made to enter the aspherical lenses 13 emerge from the spherical lenses 13 as mutually parallel beams 10A in a matrix form with a pitch (Px) of 13 mm in the x direction and a pitch (Py) of 13 mm in the y direction. The respective laser beams collimated by the spherical lenses 13 have an elliptic intensity distribution with a diameter of about 4 mm in the x direction and a diameter of about 1.5 mm in the y direction.

The incident parallel beams 10A on the integrated parallel-glass unit 14 emerge from the integrated parallel-glass unit 14 as multiple parallel beams 10 in a matrix form with Py (pitch in the y direction) of 13 mm and a pitch (Px') in the x direction of 1 mm, and is made to enter the long-focus lens 3 with a focal length of about 20 m.

After the parallel beams 10 with Px' of 1 mm and Py of 13 mm made to enter the long-focus lens 3 emerges from the long-focus lens 3, with respect to the y direction, the principal rays of the respective beams are reflected by the mirror 4 to be converged onto a mirror surface of the polygon mirror 5. However, since the focal length is relatively long at 20 m, the beam diameters of the respective beams have been enlarged to about 10 mm. On the other hand, with regard to the x direction, due to the cylindrical lens 34, the beams are converged onto the polygon mirror at a pitch Pxp (Pxp=Px'fc/fo) in the x direction, with respect to the arrangement pitch Px'=1 mm of the incident light beams on the long-focus lens in the x direction.

The polygon mirror 5 is rotating at a rotational speed of about 5,000 rpm ($\omega$rad·s$^{-1}$ in terms of angular velocity). Reflected light is made to enter the fθ lens 6, and after reflection by the mirror 62, transmits through the cylindrical lens 61 having a focal length fθC, and then, as shown in FIG. 6, forms the images of spots 80, which are formed by beams emitted from the respective LDs 12, onto the exposure surface of the exposure substrate 8 mounted on the stage 7.

Assuming that the focal length of the fθ lens 6 is fθ (mm), as the polygon mirror 5 rotates, the spots on the substrate are scanned at a speed of 2fθω (mm/s) in the −y direction of the coordinates on the stage shown in FIG. 1. The stage 7 is subjected to scanning in the −x direction in synchronism with this scanning, and the respective LDs 12 are ON-OFF controlled on the basis of drawing data previously stored in the control circuit 9, thus enabling formation of a desired pattern on the exposure substrate 8 by exposure.

Assuming that the beam diameters in the x-y direction of the respective parallel beams from the light-source optical system are respectively Dx, Dy, the beam diameters dx, dy in the x-y direction on the exposure substrate 8 can be given by the following equations.

$$dx = Dxfcf\theta c/(fof\theta)$$

$$dy = Dyf\theta c/fo$$

As mentioned above, Dx, Dy are 4, 1.5 mm (e$^{-2}$), respectively, and the focal length of each of the above-mentioned lenses is determined so that dx, dy become about 20 μm.

Further, assuming that the arrangement pitches in the scanning and sub-scanning directions of two-dimensionally arranged beams incident on the long-focus lens 3 are respectively Px', Py, their arrangement pitches PEx, PEy on the exposure substrate can be respectively represented as follows.

$$PEx = Px'f\theta/fo$$

$$PEy = Pyf\theta cfc/(fof\theta)$$

FIG. 7 is a view of another exposure apparatus according to an embodiment of the present invention.

The multiple-parallel-beam generating unit 11 incorporates violet semiconductor laser (407 nm) LDs. On the other hand, a multiple-parallel-beam generating unit 11' incorporates ultraviolet semiconductor laser (375 nm) LDs. Parallel laser light beams with a pitch of 13 mm in the x-y direction emerge from the respective multiple-parallel-beam generating units 11, 11' so as to be parallel to each other. Multiple ultraviolet LD beams of 375 nm are reflected by a mirror 15, and pass through a dichroic mirror 16. On the other hand, after reflection by the dichroic mirror, multiple violet LD beams of 407 nm pass through an optical path that substantially completely coincides with that of the multiple beams of 375 nm. The placement of the LD light sources of 407 nm and 375 nm may be reversed. In this case, naturally, the dichroic mirror 16 transmits the beams of 407 nm and reflects the beams of 375 nm.

The multiple beams of both wavelengths are together made to enter the parallel glass unit 14 that has been described in detail above. As the incident multiple beams with a pitch of 13 mm in the x direction pass through the parallel glass unit 14, the pitch in the x direction of the emergent beams is compressed to 1 mm. Since the long-focus lens 3 with an aperture of about 120 mm in diameter is subjected to color correction with respect to both the wavelengths of 375 nm and 407 nm, the principal rays of the multiple beams of both wavelengths transmitted through the long-focus lens 3 coincide with each other on the polygon mirror 5 with respect to the y direction (horizontal direction). With regard to the x direction as well, due to the color correction, the beams that have been arranged at a pitch of 1 mm as described above are converged and condensed onto the same position on the polygon mirror for both the wavelengths at a magnification fc/fo determined by the focal length fo of the spherical lens system of the long-focus lens 3 and the focal length fc of the color-corrected cylindrical lens corresponding to the fourth group from the front end.

The beams of both wavelengths reflected by the polygon mirror 5 transmit through the fθ lens 6. With respect to the y direction, the beams are condensed onto the substrate in a spot size dy determined by the following equation using the focal length fθ of the fθ lens 6, and the beam diameter Dy in the y direction and wavelength λ of incident light:

$$dy = 4f\theta\lambda/(\pi Dy)$$

On the other hand, with regard to the x direction, on the basis of the focal length of the spherical system of the fθ lens 6 and the color-corrected cylindrical lens 61 located in rear of the fθ lens, the respective beams are condensed onto the substrate in a beam diameter dx that is determined by the following equation with reference to the beam diameter Dx in the x direction of the incident light on the long-focus lens:

$$dx = Dxfcf\theta c/(fof\theta)$$

wherein dx, dy are substantially the same.

In this way, since the multiple beams of both wavelengths are simultaneously condensed onto the same position in a spot size of about 20 μm, in synchronism with the rotational speed of the polygon mirror 5, the stage 7 mounted on the exposure substrate 8 is moved in the direction indicated by the arrow in FIG. 6. Further, in synchronism with the rotation of the polygon mirror 5, the respective LDs 12 are turned ON/OFF from the controller 9 at a timing determined by the arrangement positions of the respective LDs and desired drawing information, thereby forming a desired drawing pattern on the substrate 8 by exposure at two wavelengths simultaneously.

The exposure apparatus according to this embodiment enables maskless exposure to be performed simultaneously by using LDs of wavelengths near the h-line and i-line of a mercury lamp used in the mask exposure apparatus of the related art, and allows exposure to be performed in a satisfactory manner by using an inexpensive photoresist used in the related art.

What is claimed is:

1. A device for changing a pitch between light beam axes to reduce a pitch Px of parallel light beams emitted from light sources to another desired pitch Px' in an x direction on which are arranged in the x direction and y direction in a shifted manner in the y direction, comprising:
    a first transparent member in the shape of a prism whose cross section in the x-z direction is a parallelogram and whose height perpendicular to the cross section is higher than the sum of the distance in the y direction between the most distant light sources and the diameter of said parallel light beam; and
    second transparent members, the number of which is one less than the number in the x direction of said light sources, in the shape of a prism, wherein each of the second transparent members has a cross section in the x-z direction that is a similar parallelogram to that of the first transparent member with the same interior angles, a side in the x direction that is Px-Px' in length and a height perpendicular to the cross section that is higher than the sum of the distance in the y direction between the most distance light sources and the diameter of said parallel light beam, each of the second transparent members including the same number of grooves as the number in the y direction of said light sources formed in an oblique surface of each of the second transparent members which is the surface corresponding to the side adjacent to said side of Px-Px' in length,
    the first transparent member and the second transparent members being stacked so that said oblique surface of one of the second transparent members is in direct contact with the oblique surface of the first transparent member and the surface corresponding to said side of Px-Px' in length of the second transparent members lies in one plane with the surface adjacent to said oblique surface of the first transparent member,
    wherein light trying to enter one of the grooves undergoes total reflection by the one groove.

2. The device for changing a pitch between light beam axes according claim 1,
    wherein one of interior angles of the parallelogram is 45 degrees.

3. A substrate exposure apparatus in which a spacing between optical axes of parallel beams on one side is changed by a device for changing a pitch between light beam axes, the parallel beams being outputted from a plurality of light sources arranged in a matrix and having optical axes that are spaced equidistant from each other, and in which light beams outputted from the light sources are radiated onto a target exposure substrate, comprising:
    the device for changing a pitch between light beam axes according to claim 2.

4. The device for changing a pitch between light beam axes according to claim 1,
    wherein the first transparent member and the second transparent members are made of glass.

5. The device for changing a pitch between light beam axes according to claim 4,
    wherein the first transparent member and the second transparent members are in direct contact with each other by optical contact.

6. A substrate exposure apparatus in which a spacing between optical axes of parallel beams on one side is changed by a device for changing a pitch between light beam axes, the parallel beams being outputted from a plurality of light sources arranged in a matrix and having optical axes that are spaced equidistant from each other, and in which light beams outputted from the light sources are radiated onto a target exposure substrate, comprising:
    device for changing a pitch between light beam axes according to claim 5.

7. The device for changing a pitch between light beam axes according to claim 4,
    wherein the glass includes silica as its main component.

8. A substrate exposure apparatus in which a spacing between optical axes of parallel beams on one side is changed by a device for changing a pitch between light beam axes, the parallel beams being outputted from a plurality of light sources arranged in a matrix and having optical axes that are spaced equidistant from each other, and in which light beams outputted from the light sources are radiated onto a target exposure substrate, comprising:
    device for changing a pitch between light beam axes according to claim 7.

9. A substrate exposure apparatus in which a spacing between optical axes of parallel beams on one side is changed by a device for changing a pitch between light beam axes, the parallel beams being outputted from a plurality of light sources arranged in a matrix and having optical axes that are spaced equidistant from each other, and in which light beams outputted from the light sources are radiated onto a target exposure substrate, comprising:
    the device for changing a pitch between light beam axes according to claim 4.

10. A substrate exposure apparatus in which a spacing between optical axes of parallel beams on one side is changed by a device for changing a pitch between light beam axes, the parallel beams being outputted from a plurality of light sources arranged in a matrix and having optical axes that are spaced equidistant from each other, and in which light beams outputted from the light sources are radiated onto a target exposure substrate, comprising:
    the device for changing a pitch between light beam axes according to claim 1.
    device for changing a pitch between light beam axes according to claim 7.

11. The device for changing a pitch between light beam axes according to claim 1, wherein all of the second transparent members are the same size.

12. The device for changing a pitch between light beam axes according to claim 1, wherein the grooves are offset from each other in adjacent second transparent members.

13. The device for changing a pitch between light beam axes according to claim 1, wherein the first transparent member and the second transparent members being stacked in the x direction.

* * * * *